United States Patent [19]
Inoue

[11] Patent Number: 4,760,358
[45] Date of Patent: Jul. 26, 1988

[54] PIEZOELECTRIC ELEMENT

[75] Inventor: Jiro Inoue, Kanazawa, Japan

[73] Assignee: Murata Manufacturing Co., Ltd., Japan

[21] Appl. No.: 893,937

[22] Filed: Aug. 6, 1986

[30] Foreign Application Priority Data

Aug. 7, 1985 [JP] Japan ................................ 60-174682
Nov. 19, 1985 [JP] Japan ................................ 60-260721

[51] Int. Cl.⁴ ........................ H03H 9/15; H03H 9/13; H03H 9/205
[52] U.S. Cl. ................................... 333/187; 310/366; 333/189
[58] Field of Search ............... 333/186, 187, 188, 189, 333/190, 191, 192; 310/365-368; 331/116 R, 158, 163

[56] References Cited
U.S. PATENT DOCUMENTS

4,628,285  12/1986  Nakatami et al. ................... 331/163

FOREIGN PATENT DOCUMENTS

0112644  10/1978  Japan ................................... 333/190
134883  3/1952  Sweden ................................ 310/365

OTHER PUBLICATIONS

Jumonji—"High-Impedance Piezoelectric Ceramic Resonators and Their Application to Ladder Filters", Electronics and Communications in Japan, vol. 53, No. 8, 1970; pp. 17–23.

"Webster's Seventh New Collegiate Dictionary", G & C Merriam Company, Publishers, Springfield, Mass., Copyright, 1965; p. 742 and Title Page.

Primary Examiner—Marvin L. Nussbaum
Attorney, Agent, or Firm—Ostrolenk, Faber, Gerb & Soffen

[57] ABSTRACT

A three-terminal piezoelectric filter element includes a quadrilateral piezoelectric plate having first and second surfaces, a ring electrode deposited on said first surface at the periphery of said piezoelectric plate, a center electrode deposited on said first surface at an area within said ring electrode, and a ground electrode deposited on said second surface of said piezoelectric plate. The center electrode has four arms extending from the center of piezoelectric plate in a shape of the X along the diagonals of said piezoelectric plate. The ring electrode and the center electrode may be connected to define a two-terminal piezoelectric resonator element.

15 Claims, 14 Drawing Sheets

Fig. 23a
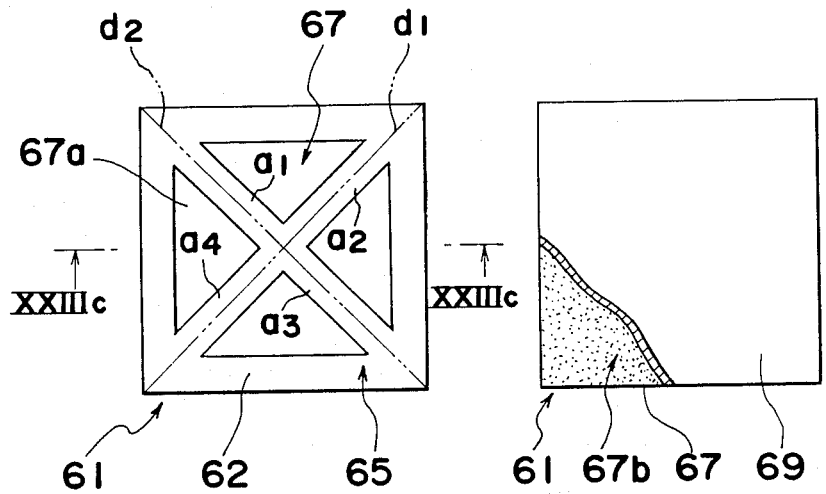
Fig. 23b
Fig. 23c
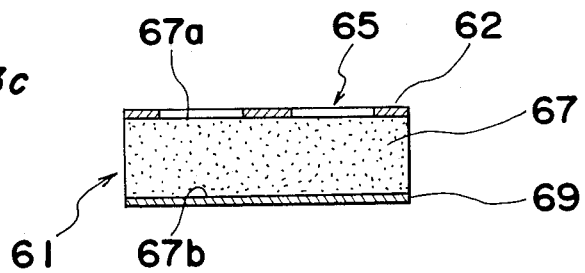
Fig. 24
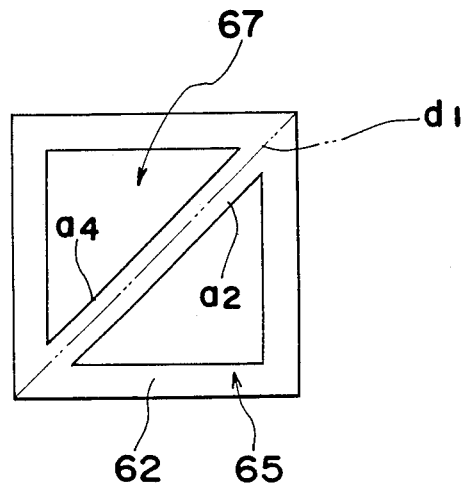

PIEZOELECTRIC ELEMENT

BACKGROUND OF THE INVENTION

1. Field of the Invention

The present invention relates to a piezoelectric element, such as a three-terminal piezoelectric filter element used, e.g., in an IF (intermediate frequency) filter for an AM radio receiver, or a two-terminal piezoelectric resonator element used, e.g., in a ladder filter or in an oscillator.

2. Description of the Prior Art

An example of a three-terminal piezoelectric filter element 5 is shown in FIGS. 1a-1c, which includes a rectangular piezoelectric plate 1, a ring electrode 2, a center electrode 3 and a ground electrode 4. Ring electrode 2 and center electrode 3 are deposited on one surface of piezoelectric plate, and ground electrode 4 is deposited on the other surface thereof.

When the three-terminal piezoelectric filter elements are employed in an IF filter of an AM radio receiver, two or more filter elements 5 are connected in cascade with a coupling capacitor Co inserted in the data transmission line D, for example as shown in FIG. 2. In FIG. 2, the data transmission line D is connected between two center electrodes, but it can be connected between two ring electrodes, or between center and ring electrodes. The capacitor Co inserted in the data transmission line is provided for reducing the coupling efficiency.

From the viewpoint of minimizing the size of the IF filter, it is preferable to eliminate the coupling capacitor Co which is usually provided externally to the chip element containing other circuit elements. However, when the coupling capacitor Co is eliminated so as to directly connect the center electrodes, the coupling efficiency will not be decreased to the required level. In this case, the coupling efficiency may be reduced by reducing the electrostatic capacitance between the center electrode 3 and ground electrode 4, and also reducing the conversion efficiency between the electric signal and the mechanical movement in the filter element. However, when the center electrode is reduced in size, there arises another problem namely that unwanted spurious mode vibration will be produced at frequency ranges of 3, 5 and 7 times the filtering frequency. Therefore, in the prior art, no IF filter of the above described type, without a coupling capacitor Co, has been practically used.

An example of a two-terminal piezoelectric resonator element 55 is shown in FIGS. 3a-3c, which includes a rectangular piezoelectric plate 57, a first electrode 58 and a second electrode 59. The first electrode 58 and the second electrode 59 are deposited on the opposite surfaces of the piezoelectric plate. The size of the first electrode 58 is smaller than that of the second electrode 59 so as to reduce the electrostatic capacitance. In use, at least one serial connected two-terminal piezoelectric resonator 55 and at least one parallel connected two-terminal piezoelectric resonator 56 are connected in a manner shown in FIG. 4 to define a ladder filter between input terminals 51 and 52 and output terminals 53 and 54.

However, when the first electrode is reduced in size, there arises the same problem as mentioned above, namely that unwanted spurious mode vibration will be produced at frequency ranges of 1.5, 3, 5 and 7 of the resonance frequency.

SUMMARY OF THE INVENTION

The present invention has been developed with a view to substantially solving the above described disadvantages and has for its principal object to provide an improved piezoelectric element, such as a three-terminal piezoelectric filter element, or a two-terminal piezoelectric resonator element, which has a small electrostatic capacitance and less spurious mode vibrations.

It is a further object of the present invention to provide an improved piezoelectric element of the above described type which can readily be manufactured.

In accomplishing these and other objects, a three-terminal piezoelectric filter element according to one preferred embodiment of the present invention comprises a quadrilateral piezoelectric plate having first and second surfaces, a ring electrode deposited on the first surface at the periphery of the piezoelectric plate, a center electrode deposited on the first surface at an area within the ring electrode, and a ground electrode deposited on the second surface of the piezoelectric plate. The center electrode has least one arm extending along at least one diagonal of the piezoelectric plate.

According to another embodiment of the present invention, a two-terminal piezoelectric resonator element comprises a quadrilateral piezoelectric plate having first and second surfaces, a first electrode deposited on the first surface, and a second electrode deposited on the second surface of the piezoelectric plate. The first electrode is defined by a rim portion provided at the periphery of the piezoelectric plate, and a center portion having at least one arm extending along at least one diagonal of the piezoelectric plate.

BRIEF DESCRIPTION OF THE DRAWINGS

These and other objects and features of the present invention will become apparent from the following description preferred embodiments thereof with reference to the accompanying drawings, throughout which like parts are designated by like reference numerals, and in which:

FIGS. 23a, 23b and 23c are top plan view, bottom plan view, and cross-sectional view of a two-terminal piezoelectric resonator element according to a second embodiment of the present invention; and FIG. 24 is a top plan view showing a modification of the second embodiment.

DESCRIPTION OF THE PREFERRED EMBODIMENTS

About Spurious Mode Vibrations

Before the description of preferred embodiments of the present invention proceeds, spurious mode vibrations will be explained in connection with FIG. 5 and FIGS. 6a–6l.

Figure 5:
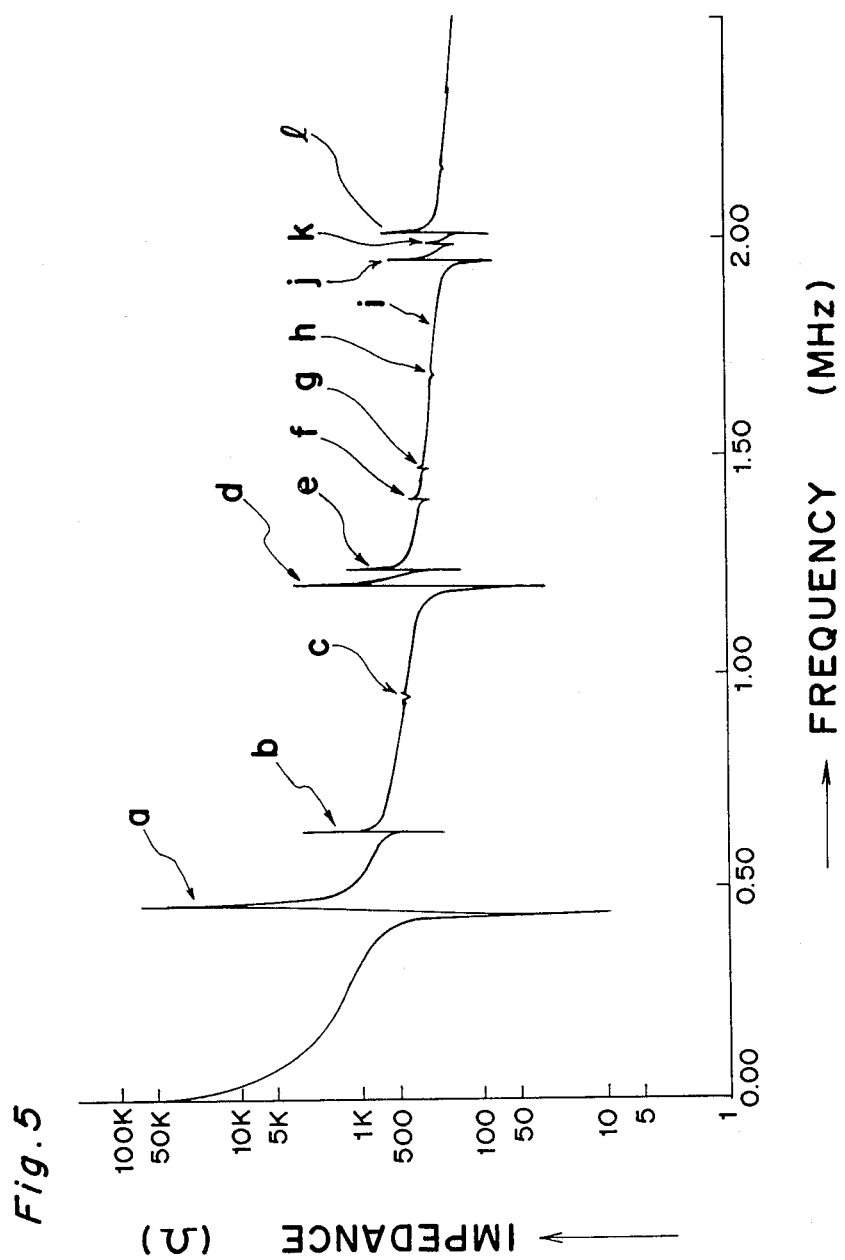
FIG. 5 is a graph showing an impedance characteristic of a rectangular piezoelectric element.

To investigate spurious mode vibrations, an impedance characteristic of a piezoelectric element test model, having a dimension of 4.9×4.9×0.5 (mm) with electrodes deposited entirely on the opposite flat surfaces, was first detected. The materials used for the piezoelectric element test model were the same as for those shown in FIG. 1a or FIG. 3a or in any of the elements used in the present invention. The impedance characteristic as detected is shown in FIG. 5, in which the peak "a" represents an impedance change at the frequency for the required or dominant mode of vibration, and other peaks "b"–"l" represent impedance changes at the frequencies for the spurious mode vibrations.

Figure 6A:
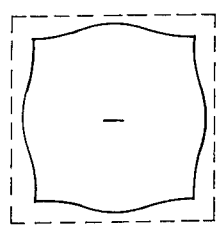
FIGS. 6a-6l are diagrams showing charge distributions on the rectangular piezoelectric element for the dominant mode vibration and various spurious mode vibrations.
Figure 6B:
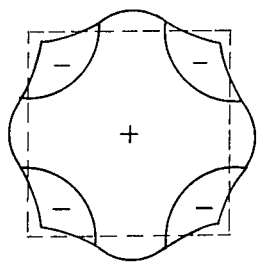
Figure 6C:
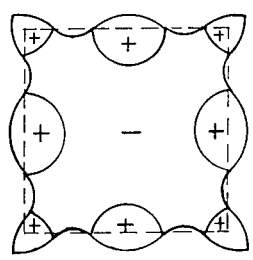

The obtained impedance characteristic was compared with an impedance characteristic obtained by computer simulation of the same model through the finite element method, and it was found that the impedance characteristic obtained by the computer simulation was very similar to the one obtained through the actual test. Further using the computer, charge distributions for the different vibration frequencies were obtained. In FIG. 6a, a charge distribution of the dominant mode of vibration is shown. The rectangular area indicated by a dotted line represents the configuration of the piezoelectric element, and the area surrounded by a solid line represents the distribution of the charges, such as (−) charges, observed at one instant. At the next instant, e.g., a half cycle later, the area surrounded by the solid line will be filled with the (+) charges. FIG. 6b shows a charge distribution of the first spurious mode of vibration which corresponds to the peak "b" shown in FIG. 5. Similarly, FIGS. 6c–6l show charge distributions of the spurious mode of vibrations corresponding to the peaks "c"–"l" shown in FIG. 5. As apparent from FIG. 5, since the spurious mode vibrations produced at peaks "c", "g", "h" and "i" are very weak, having a very small amplitude, they can be disregarded. The piezoelectric element according to the present invention is so arranged as to suppress or eliminate the spurious mode vibrations in a manner described below, particularly the spurious mode vibrations produced at peaks "b", "e", "f", "j", "k" and "l", which have charge distributions shown in FIGS. 6b, 6e, 6f, 6j, 6k and 6l, respectively.

FIRST EMBODIMENT

Figure 7A:
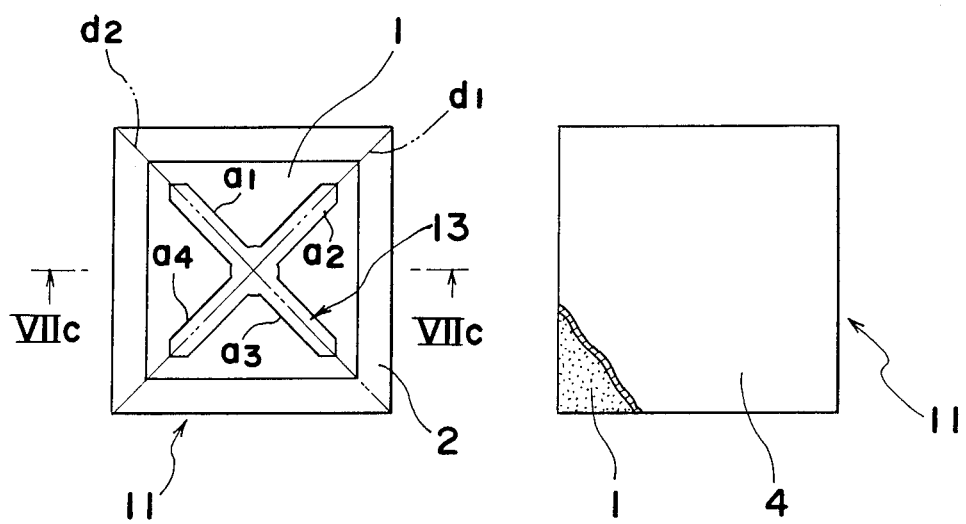
FIGS. 7a, 7b and 7c are top plan view, bottom plan view and cross-sectional view of a three-terminal piezoelectric filter element according to a first embodiment of the present invention.
Figure 7B:
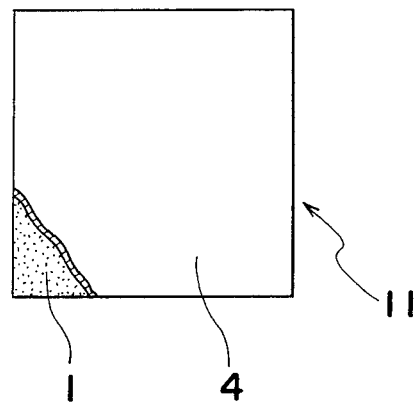
Figure 7C:
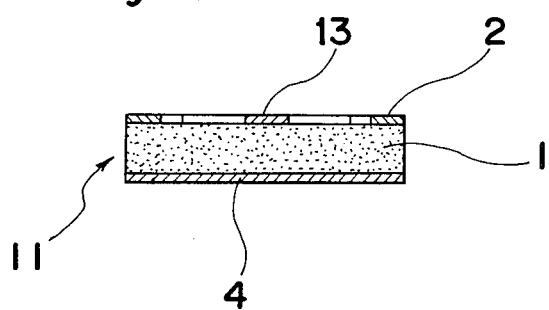

Referring to FIGS. 7a, 7b and 7c, a three-terminal piezoelectric filter element 11 according to a first embodiment of the present invention is shown. The three-terminal piezoelectric filter element 11 comprises a quadrilateral, such as a rectangular, piezoelectric plate 1 having opposite flat surfaces. A ground electrode 4 is deposited on the entirety of one of the flat surfaces of plate 1, and a ring electrode 2 and center electrode 13 are deposited on the other flat surface. Ring electrode 2 is provided at the rim of said other flat surface and center electrode 13 is provided within the area surrounded by ring electrode 2. According to the first embodiment, ring electrode 2 has four arms a1, a2, a3 and a4 extending from the center of the piezoelectric plate along the diagonals d1 and d2 in a shape of an X. When center electrode 13 is arranged as shown in FIG. 7a, the area of center electrode 13 is reduced, when compared with that shown in FIG. 1a, thus reducing the electrostatic capacitance. The electrostatic capacitance can be easily changed by the change of width of each of the arms a1, a2 a3 and a4. The spurious mode vibrations are suppressed in a manner described below.

Figure 6D:
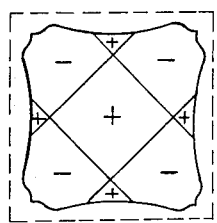

The spurious mode vibration at peak "d" has the charge distribution shown in FIG. 6d wherein the (+) charges are located in the center and the (−) charges are located at four corners. When the center electrode 13 is applied, arms a1–a4 bridge the (−) and (+) charge regions, thereby counterbalancing the charges accumulated in these regions to nullify the distribution shown in FIG. 6d. Thus, the spurious mode vibration is eliminated or suppressed. In a similar manner, by the diagonally extended arms, the charge distributions shown in FIGS. 6e, 6f, 6j, 6k and 6l are nullified to suppress the spurious mode vibrations.

Figure 6E:
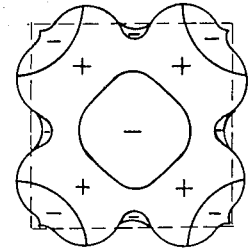
Figure 6F:
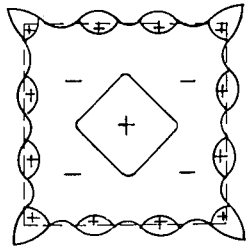
Figure 6G:
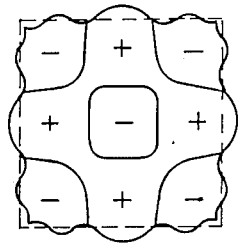
Figure 6H:
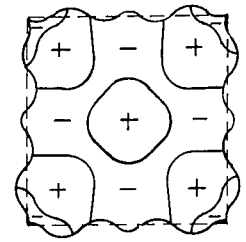
Figure 6I:
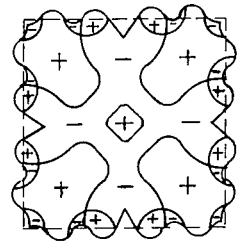
Figure 6J:
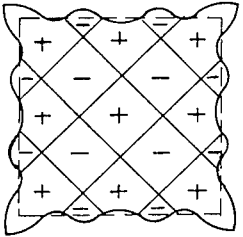
Figure 6K:
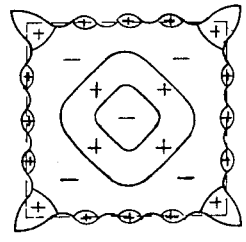
Figure 6L:
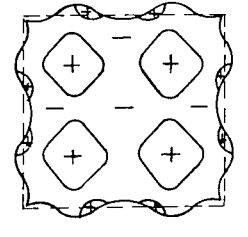

When the charge distribution has regions located at the peripheral portions of the piezoelectric element, such as charge distributions shown in FIGS. 6b, 6e and 6f, ring electrode 2 serves to counterbalance these charges.

Figure 2:
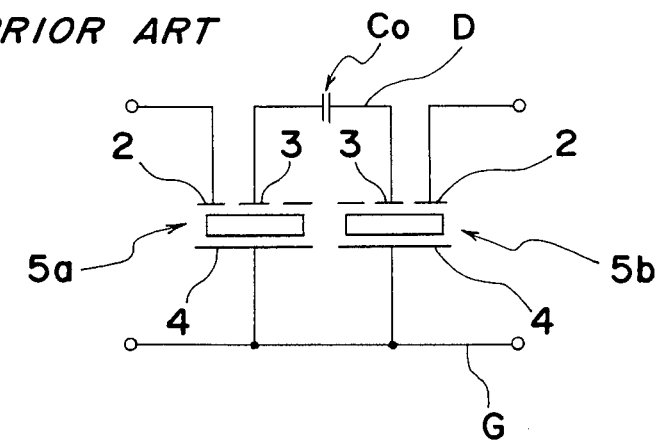
FIG. 2 shows a circuit diagram of an IF filter employing the three-terminal piezoelectric filter element of FIGS. 1a-1c.

Accordingly, when the piezoelectric filter element 11, according to the present invention, is employed in an IF filter, such as shown in FIG. 2, it is not necessary to insert a coupling capacitor Co in the data transmission line D, thereby making it possible to provide a compact size IF filter.

MODIFICATIONS OF THE FIRST EMBODIMENT

Next, various modifications of the first embodiment will be described in connection with FIGS. 8–13c.

Figure 8:
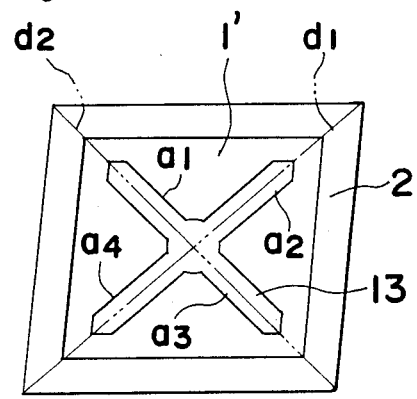
FIGS. 8, 9, 10, 11 and 12 are top plan views showing different modifications of the three-terminal piezoelectric filter element of FIGS. 7a-7c.
Figure 10:
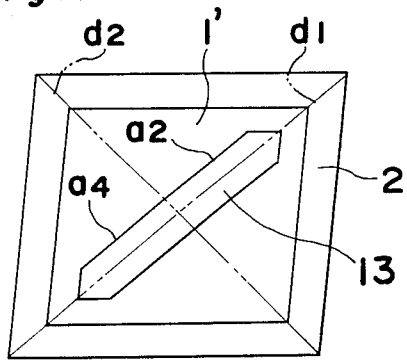

According to the present invention, the piezoelectric plate 1 is not necessarily rectangular, but can be arranged in other shapes such as a parallelogram, as shown in FIG. 8 or 10.

Figure 9:
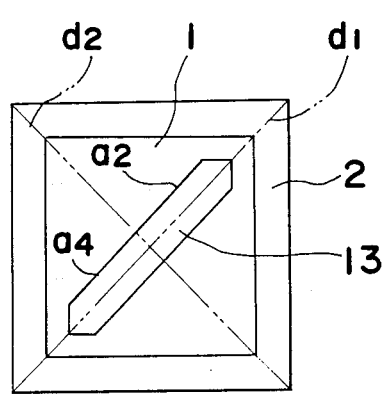
Figure 11:
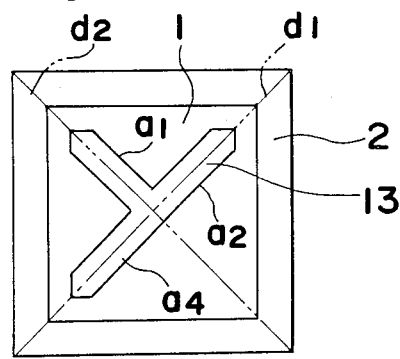
Figure 12:
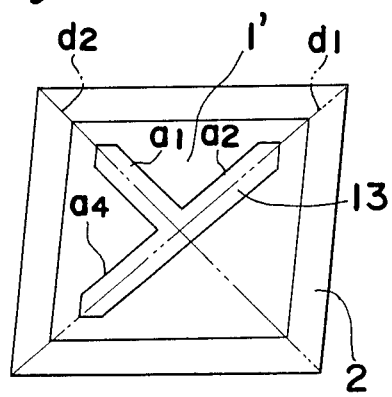

Also, according to the present invention, the number of arms for the center electrode 13 can be less than four, such as three, as shown in FIG. 11 or 12, or two, as shown in FIG. 9 or 10, provided that arms are extending along the diagonals d1 and/or d2. When a three-arm structure is to be employed, any three of the four arms a1–a4 may be provided so as to be arranged in a shape of T. For example, in FIG. 12, arms a1, a2 and a4 are provided, but instead, arms a1, a3 and a4 may be provided. Also, when a two-arm structure is to be employed, any two of the four arms may be provided so as to be arranged either straight, or in a shape of V. For example, in FIG. 10 arms a2 and a4 are provided, but instead, arms a1 and a3 may be provided. Alternately, arms a1 and a2, or arms a2 and a3 may be provided.

Figures 13A, 13B, 13C:
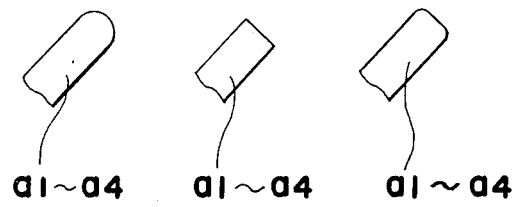
FIGS. 13a, 13b and 13c are fragmentary views, showing different shapes for the ends of the electrode arms in the first embodiment.

Furthermore, according to the present invention, the end of each arm, which has been shown as tapered, may be rounded, as shown in FIG. 13a, or may be presented in a cut edge form to provide two right angle corners as shown in FIG. 13b. These corners may be rounded, such as shown in FIG. 13c.

Furthermore, although not shown, indents or projections may be formed in each arm. Also, the arms may be bent or curved, as long as the arms generally extend along the diagonal directions.

OPERATION

Figure 14:
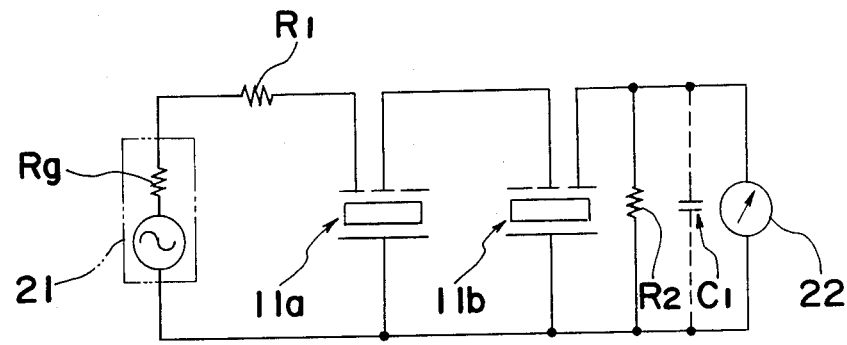
FIG. 14 is a circuit diagram of an IF filter for an AM radio receiver, employing the piezoelectric filter elements of the present invention.

Two piezoelectric filter elements according to FIGS. 7a–7c are connected in the IF filter of an AM radio receiver, in a manner shown in FIG. 14, so as to obtain a frequency characteristic, a spurious characteristic, and various other filter data. In the test operation, signals having frequencies of 445–465 KHz and 0–10 MHz are inputted from a standard signal generator 21 to the first stage piezoelectric filter element 11a, and the signals outputted from the second stage piezoelectric filter element 11b are detected by a high frequency voltage meter 22. In the circuit of FIG. 14, the circuit elements have the following specifications:

Rg+R1=R2=3000Ω
C1=50 pF

Figure 17:
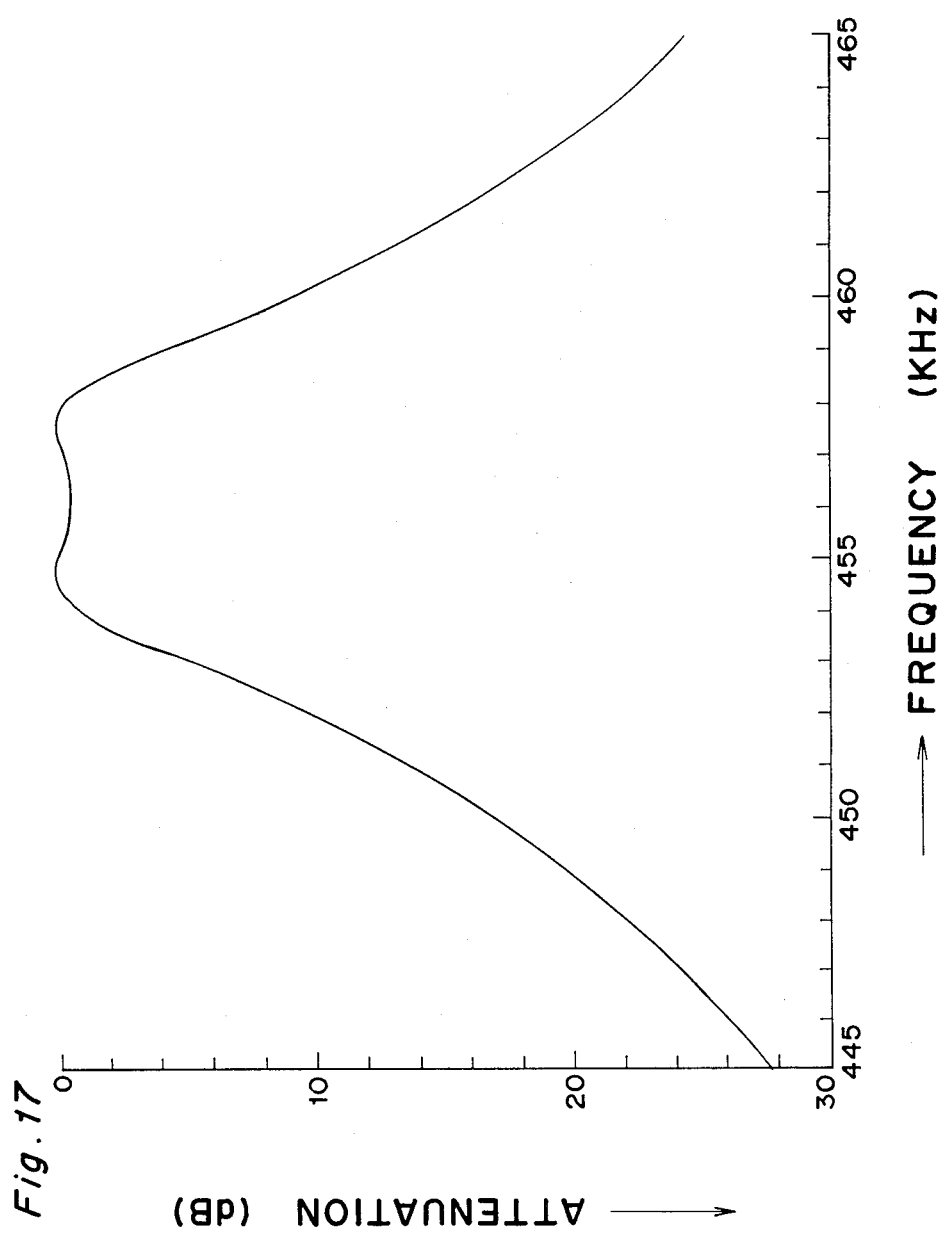
FIG. 17 is a graph showing a frequency characteristic of the IF filter of FIG. 14.
Figure 18:
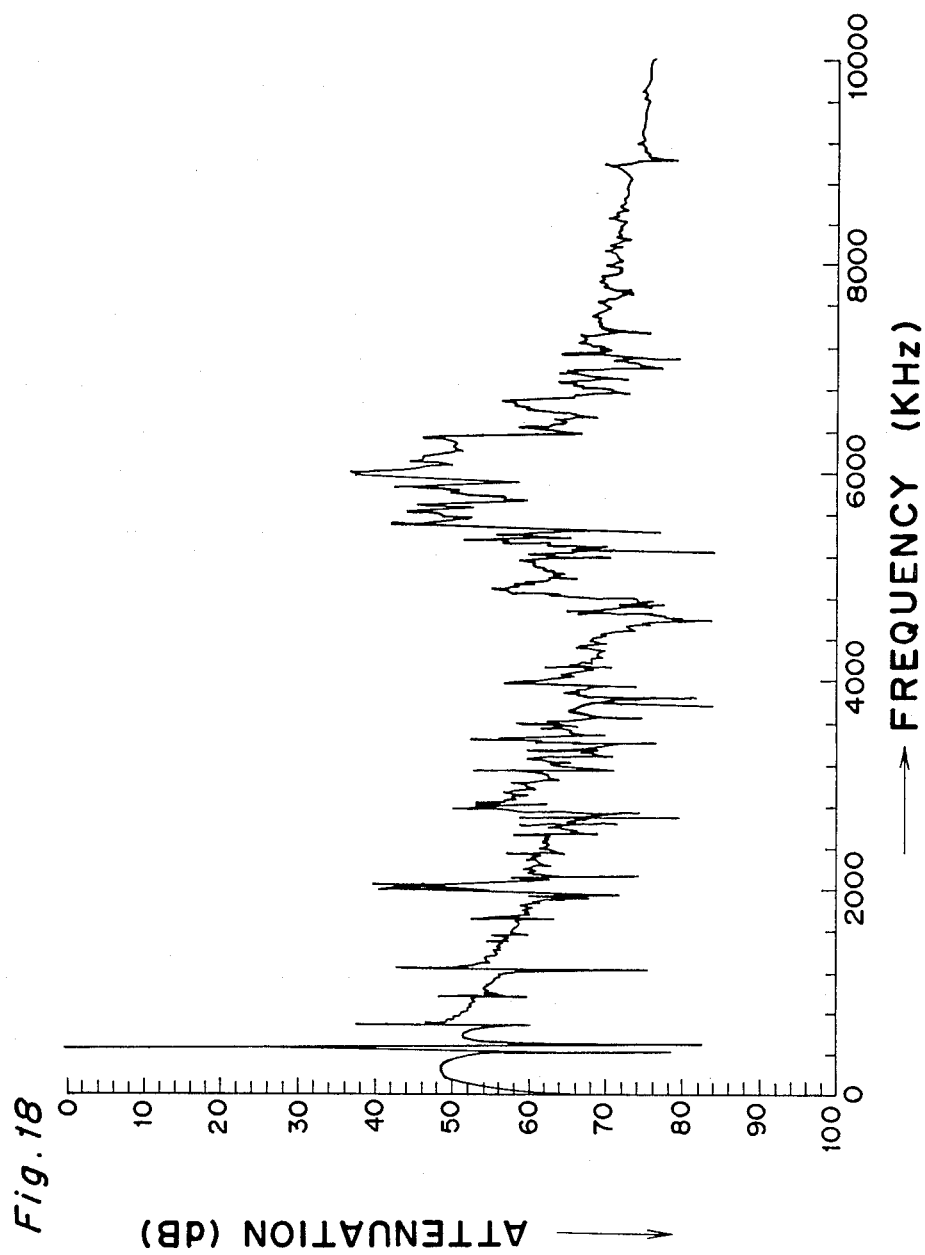
FIG. 18 is a graph showing a spurious characteristic of the IF filter of FIG. 14.

The detected result is that FIG. 17 shows the frequency characteristic, FIG. 18 shows the spurious characteristic and the various filter data are shown in Table 1 below.

TABLE 1

| Center frequency (fo): | 455.6 KHz |
| --- | --- |
| Insertion loss: | 4.4 dB |
| Ripple (within 3 dB bandwidth) | 0.7 dB |
| 3 dB bandwidth | 5.8 KHz |
| Selectivity (fo + 9 KHz) | 23.6 dB |
| Selectivity (fo − 9 KHz) | 22.4 dB |
| Spurious (0–3 MHz) | 40.2 dB |

Figure 15:
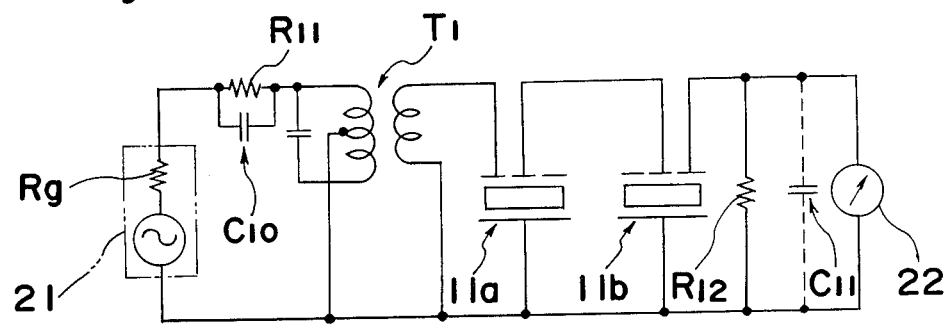
FIG. 15 is a circuit diagram similar to FIG. 14, but further employing a transformer.

Referring to FIG. 15, another IF filter is shown which further has a transformer T1 connected at the input side of the first stage piezoelectric filter element 11a. In the circuit of FIG. 15, the circuit elements have the following specifications:

| R11 = 300 Ω | R12 = 2K Ω |
| --- | --- |
| C10 = 7 pF | C11 = 50 pF |

Figure 19:
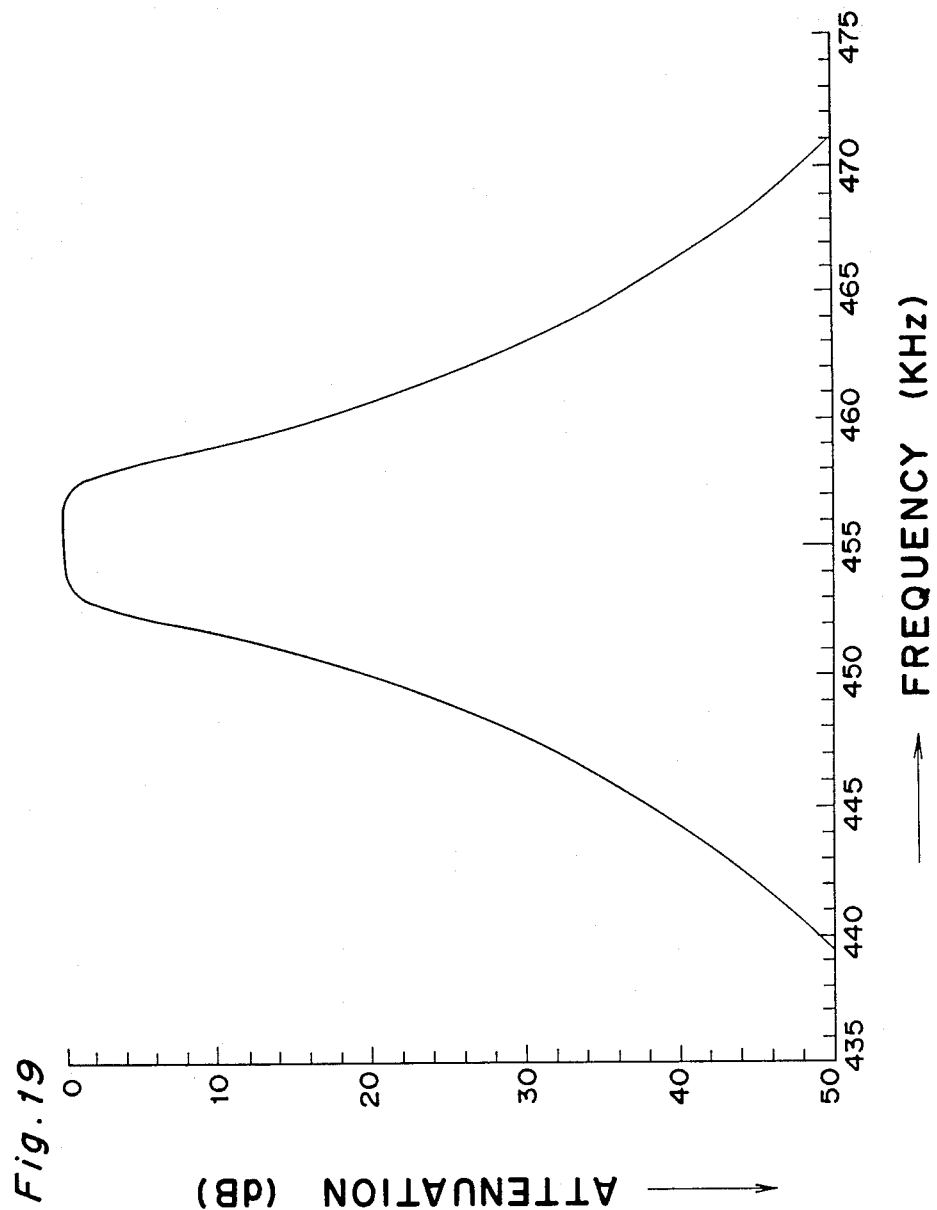
FIG. 19 is a graph showing a frequency characteristic of the IF filter of FIG. 15.
Figure 20:
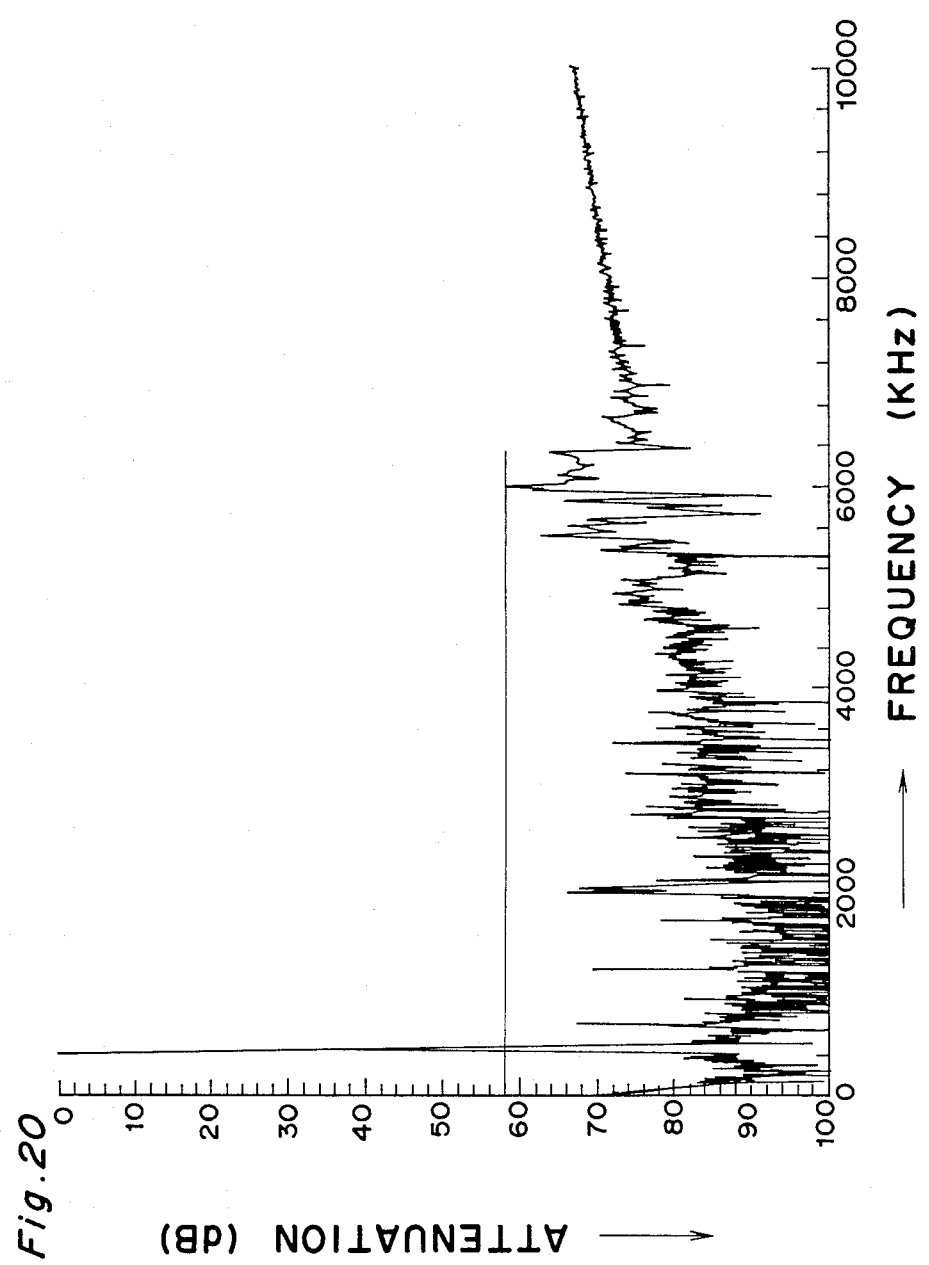
FIG. 20 is a graph showing a spurious characteristic of the IF filter of FIG. 15.

The same test operations are carried out for the circuit of FIG. 15, and the detected result is that FIG. 19 shows the frequency characteristic, FIG. 20 shows the spurious characteristic and the various filter data are shown in Table 2 below.

TABLE 2

| Center frequency (fo): | 454.6 KHz |
| --- | --- |
| Input level (output power 0.6 mV) | 77.5 dB |
| Ripple (within 6 dB bandwidth) | 0 dB |
| 6 dB bandwidth | 7.0 KHz |
| Selectivity (fo + 9 KHz) | 31.6 dB |
| Selectivity (fo − 9 KHz) | 31.6 dB |
| Spurious (0–3 MHz) | 67.0 dB |

Figure 1A:
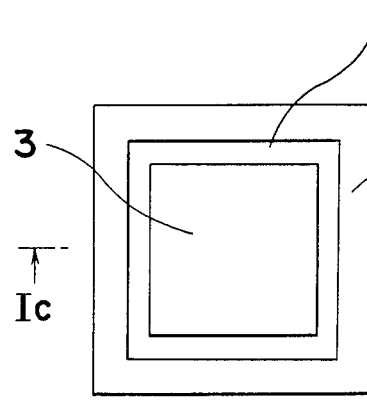
FIGS. 1a, 1b and 1c show a three-terminal piezoelectric filter element according to a prior art design.
Figure 1B:
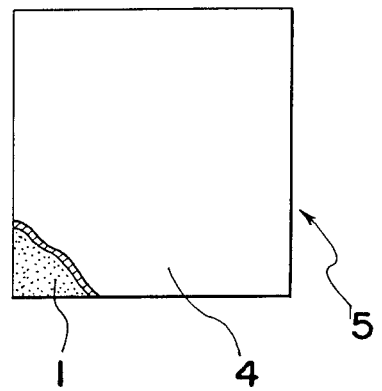
Figure 1C:
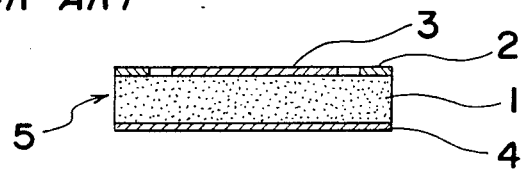
Figure 16:
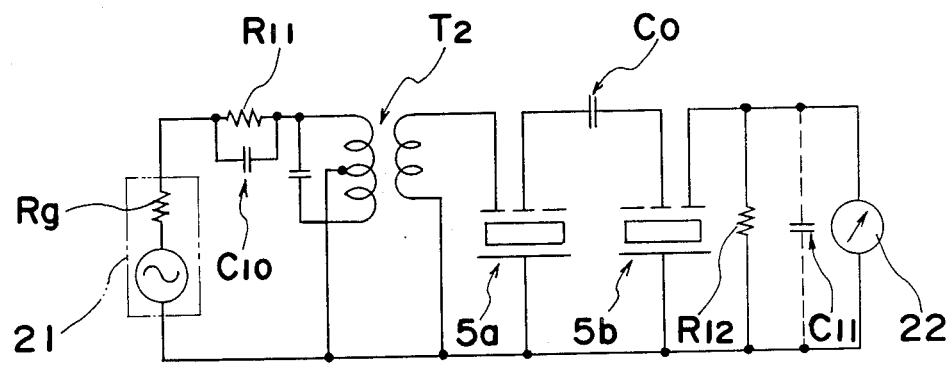
FIG. 16 is a circuit diagram, which is the same as that of FIG. 15, but employing a prior art piezoelectric filter element together with a coupling capacitor.

Referring to FIG. 16, a circuit similar to FIG. 15 is shown for the purpose of comparison. In place of the piezoelectric filter elements 11a and 11b, the prior art piezoelectric filter elements 5a and 5b, as shown in FIGS. 1a–1c, are provided, together with the coupling capacitor Co.

Figure 21:
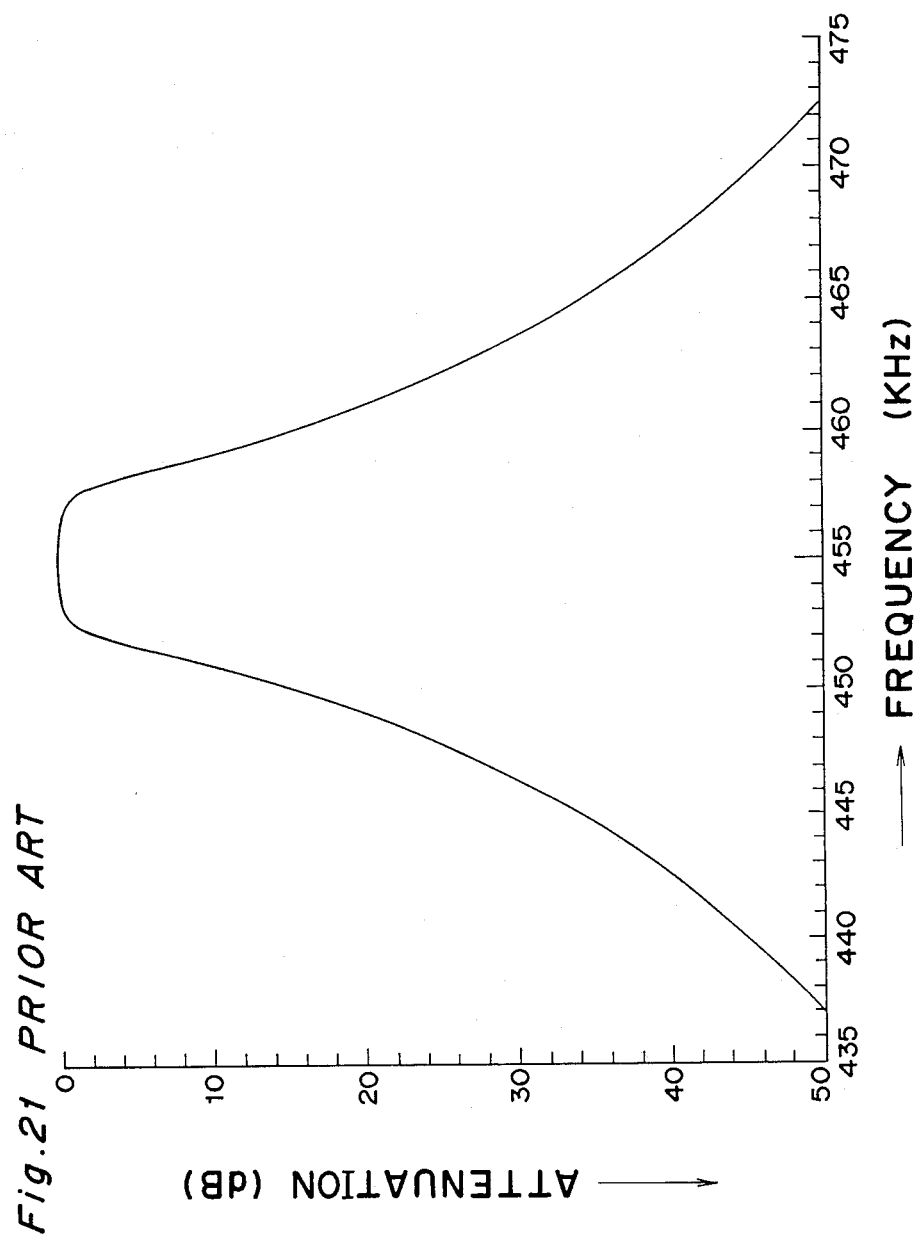
FIG. 21 is a graph showing a frequency characteristic of the IF filter of FIG. 16.
Figure 22:
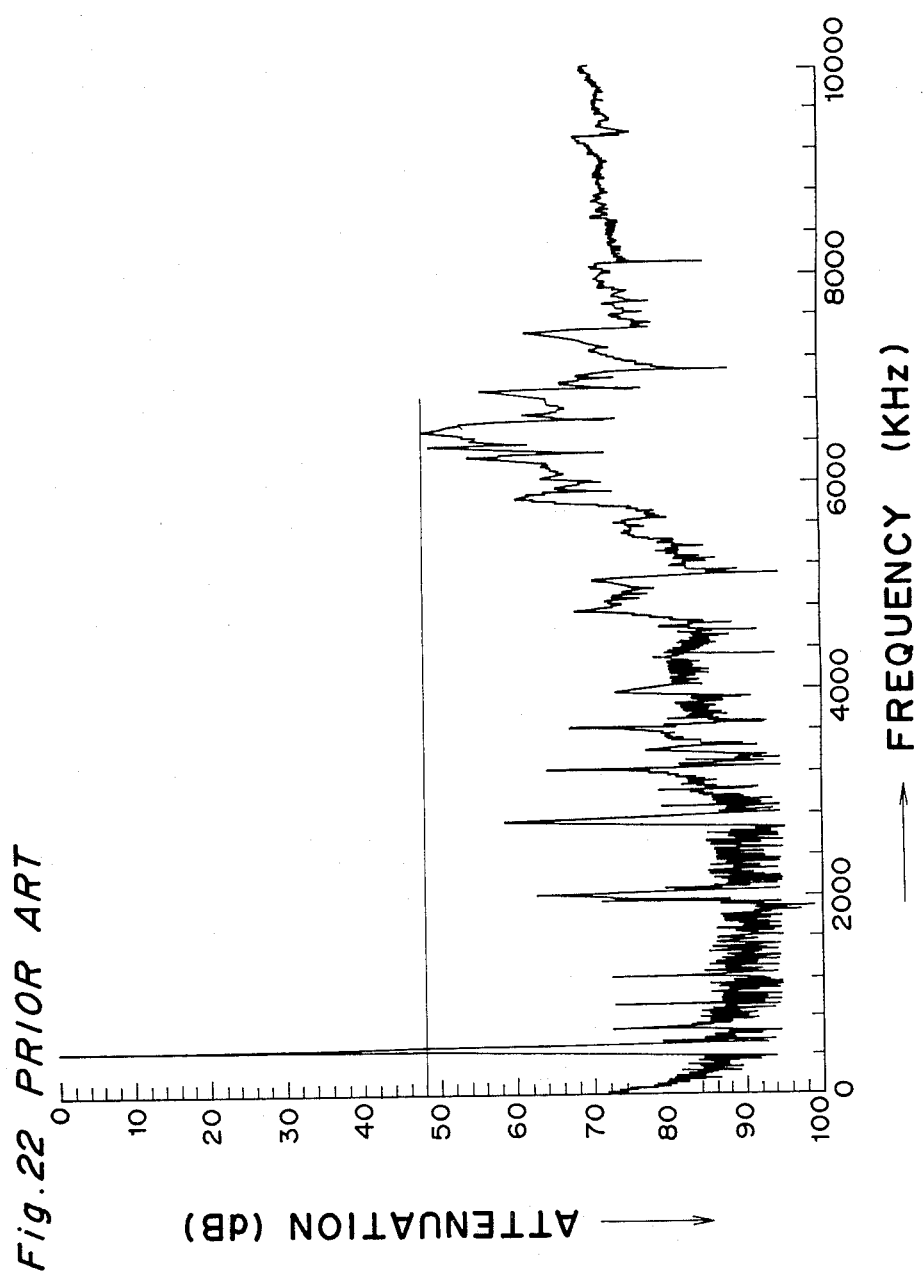
FIG. 22 is a graph showing a spurious characteristic of the IF filter of FIG. 16.

The same test operations are carried out for the circuit of FIG. 16, and the detected result is that FIG. 21 shows the frequency characteristic, FIG. 22 shows the spurious characteristic and the various filter data are shown in Table 3 below.

TABLE 3

| Center frequency (fo): | 455.0 KHz |
| --- | --- |
| Input level (output power 0.6 mV) | 77.4 dB |
| Ripple (within 6 dB bandwidth) | 0 dB |
| 6 dB bandwidth | 7.0 KHz |
| Selectivity (fo + 9 KHz) | 31.4 dB |
| Selectivity (fo − 9 KHz) | 31.3 dB |
| Spurious (0–3 MHz) | 59.0 dB |

By the above test results, it is seen that the IF filter (FIG. 15) employing piezoelectric filter elements, according to the present invention, has operational characteristics similar to the IF filter (FIG. 16) employing prior art piezoelectric filter elements. In fact, the IF filter (FIG. 15) according to the present invention showed better spurious mode suppression than the IF filter (FIG. 16) of the prior art.

For example, when Tables 2 and 3 are compared, it is understood that the IF filter (FIG. 15) according to the present invention suppresses the spurious mode vibrations in the frequency range 0–3 MHz about 8 dB more than the IF filter (FIG. 16) of the prior art.

Also, the peak of the attenuation in the frequency region above the center frequency fo is about 58 dB for the IF filter (FIG. 15) according to the present invention, whereas the same is about 48 dB for the IF filter of the prior art. Thus, it can be said that the IF filter (FIG. 15) according to the present invention suppresses the thickness spurious mode vibrations in the frequency range 5.5–7 MHz about 10 dB more than the IF filter (FIG. 16) of the prior art. It is to be noted that piezoelectric filter elements 5a and 5b and piezoelectric filter elements 11a and 11b have different thickness. The suppression of the thickness spurious mode vibrations can be understood such that the surface charge caused by the thickness mode vibration will be intensely distributed at the center of the piezoelectric element so that the small size center electrode will result in the reduction of the driving efficiency.

SECOND EMBODIMENT AND ITS MODIFICATIONS

Referring to FIGS. 23a, 23b and 23c, a two-terminal piezoelectric resonator element 61 according to a second embodiment of the present invention is shown. The two-terminal resonator element 61 comprises a quadrilateral, such as a rectangular, piezoelectric plate 67 having opposite flat surfaces 67a and 67b. A first electrode 65 is deposited on one flat surface 67a and a second electrode 69 is deposited on the other flat surface 67b. The first electrode 65 is defined by a ring portion 62 extending to form a rectangular frame along the peripheral portion of the flat surface 67a and four arms a1, a2, a3 and a4 extending along the diagonals d1 and d2 from the four corners so as to define a cross within the ring portion. The second electrode 69 is deposited over the entirety of the flat surface 67b.

When the first electrode 65 is arranged in a manner shown in FIG. 23a the area of the first electrode 65 may be reduced, when compared with that shown in FIG. 1a, thus reducing the electrostatic capacitance. The electrostatic capacitance can be easily changed by changing the width of each of the arms a1, a2, a3 and a4. By means of a arms a1, a2, a3 and a4, the spurious mode vibrations may be suppressed in the same manner as described above.

The two-terminal piezoelectric resonator element according to the second embodiment may be varied in various manners. For example, the number of arms a1-a4 may be less than four, such as two arms a2 and a4, as shown in FIG. 24, so long as the arms extend generally along the diagonals d1 and/or d2. Also, the piezoelectric resonator element can be arranged in the shape of a parallelogram, as in the modification of the first embodiment.

Figure 3A:
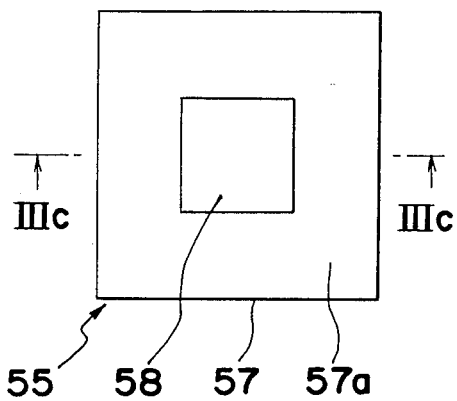
FIGS. 3a, 3b and 3c show a two-terminal piezoelectric resonator element according to a prior art design.
Figure 3B:
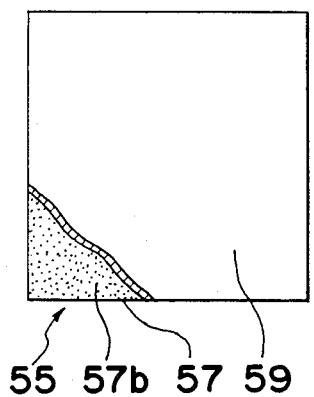
Figure 3C:
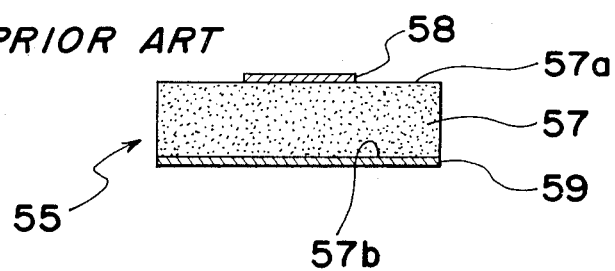

When the piezoelectric resonator element of the present invention is employed in a ladder filter, at least one of the serial connected two-terminal piezoelectric resonator elements should be the two-terminal piezoelectric resonator element of the present invention shown in FIGS. 23a-23c, and other serial connected two-terminal piezoelectric resonator elements can be the ones according to the prior art, such as shown in FIGS. 3a-3c. The parallel connected two-terminal piezoelectric resonator elements should be the ones according to the prior art. When the ladder filter is arranged in a manner described above, the spurious mode vibrations can be suppressed and, at the same time, the ladder filter can be arranged in a compact size as explained below.

Figure 4:
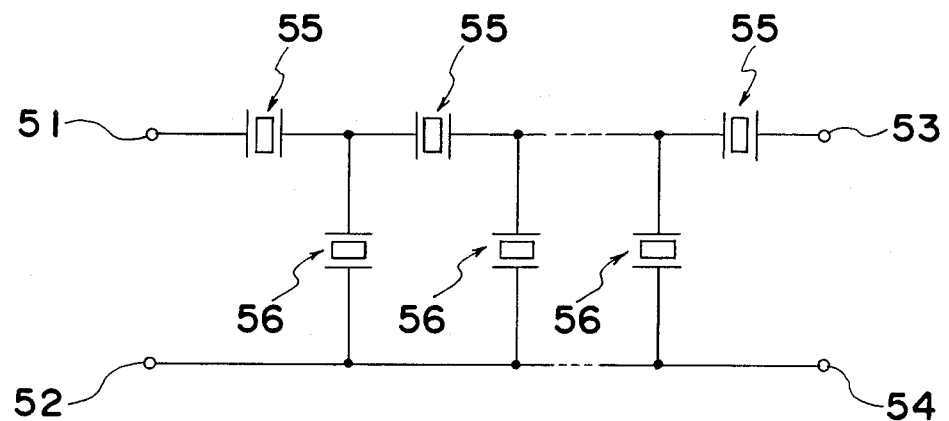
FIG. 4 shows a circuit diagram of a ladder filter employing the two-terminal piezoelectric resonant element of FIGS. 3a 3c.

From the viewpoint of reducing the size of the ladder filter (FIG. 4), the number of the piezoelectric resonator elements should be reduced, and at the same time, the size of each resonator element should be reduced, but the required filter characteristics should not be lost. To this end, it is necessary to increase the electrostatic capacitance ratio of resonator 55, connected in series, to resonator 56, connected in parallel. This will result in the deterioration of the shape factor of the filter characteristic, but it can be improved by using resonators 55 and 56 having a large mechanical quality factor Qm. To increase the electrostatic capacitance ratio of resonator 55 to 56, the dielectric constant of the piezoelectric element 55 should be reduced and, at the same time, the thickness of the piezoelectric element 55 should be increased. Furthermore, the dielectric constant of the piezoelectric element 56 should be increased and, at the same time, the element 56 should be made thinner. However, if the piezoelectric element 55 is made thicker, the size of the ladder filter may not be reduced to the required size. Also, if the piezoelectric element 56 is made thinner, the piezoelectric element will be easily broken. However, by the use of the resonator elements of the present invention, the electrostatic capacitance can be easily controlled by changing the width of the arms a1–a4, without changing the required filter characteristics, or the thickness of the resonator element.

Although the present invention has been fully described with reference to several preferred embodiments, many modifications and variations thereof will now be apparent to those skilled in the art, and the scope of the present invention is therefore to be limited not by the details of the preferred embodiments described above, but only by the terms of the appended claims.

I claim:

1. A three-terminal expansion mode piezoelectric filter element comprising:
    a quadrilateral piezoelectric plate having first and second surfaces; and means for inducing expansion mode vibration in said piezoelectric plate, said means comprising:
    a rim electrode deposited on said first surface along at least part of the periphery of said piezoelectric plate;
    a center electrode deposited on said first surface in an area within said rim electrode, said center electrode having a central portion and at least two arms extending from said central portion in opposite directions along at least one diagonal of said piezoelectric plate; and
    a ground electrode deposited on said second surface of said piezoelectric plate;
    said rim and center electrodes being insertable in a signal transmission line and said ground electrode being connectable to ground for inducing said expansion mode vibration.

2. A three-terminal piezoelectric filter element according to claim 1 wherein said piezoelectric plate is substantially rectangular.

3. A three-terminal piezoelectric filter element according to claim 1 wherein said piezoelectric plate is substantially a parallelogram.

4. A three-terminal piezoelectric filter element according to claim 1 wherein said center electrode comprises four arms extending from said central portion of said piezoelectric plate in a shape of an X along diagonals of said piezoelectric plate.

5. A three-terminal piezoelectric filter element according to claim 1 wherein said center electrode comprises three arms extending from said central portion of said piezoelectric plate generally in the shape of a T along diagonals of said piezoelectric plate.

6. A three-terminal piezoelectric filter element according to claim 1 wherein each said arm has an end away from said central portion tapered.

7. A three-terminal piezoelectric filter element according to claim 1 wherein each said arm has an end away from said central portion rounded.

8. A three-terminal piezoelectric filter element according to claim 1 wherein each said arm has an end away from said central portion defined by two right angle corners.

9. A filter comprising:
    at least first and second three-terminal piezoelectric filter elements, each comprising:

a quadrilateral piezoelectric plate having first and second surfaces;

a rim electrode deposited on said first surface along at least part of the periphery of said piezoelectric plate;

a center electrode deposited on said first surface in an area within said rim electrode, said center electrode having at least one arm extending along at least one diagonal of said piezoelectric plate; and a ground electrode deposited on said second surface of said piezoelectric plate and being connected to ground;

an input line connected to either one of said rim electrode and said center electrode of said first three-terminal piezoelectric filter element;

a data transmission line connected between (a) the other one of said rim electrode and said center electrode of said first three-terminal piezoelectric filter element and (b) either one of said rim electrode and said center electrode of said second three-terminal piezoelectric filter element; and an output line connected to the other one of said rim electrode and said center electrode of said second three-terminal piezoelectric filter element.

10. A two-terminal expansion mode piezoelectric resonator element comprising:

a quadrilateral piezoelectric plate having first and second surfaces; and means for inducing expansion mode vibration in said piezoelectric plate, said means comprising:

a first electrode deposited on said first surface, said first electrode including a rim portion provided along at least part of the periphery of said piezoelectric plate, and a generally linear center portion formed continuous with said rim portion on said first surface and thereby electrically connected to the rim portion and extending along at least one diagonal of said piezoelectric plate; and a second electrode deposited on said second surface of said piezoelectric plate.

11. A two-terminal piezoelectric resonator element according to claim 10 wherein said piezoelectric plate is substantially rectangular.

12. A two-terminal piezoelectric resonator element according to claim 10 wherein said piezoelectric plate is substantially a parallelogram.

13. A two-terminal piezoelectric resonator element according to claim 10 wherein said center portion of said first electrode comprises four generally linear arms extending from a center of said piezoelectric plate to said rim portion in a shape of an X along diagonals of said piezoelectric plate.

14. A two-terminal piezoelectric resonator element according to claim 10 wherein said center portion of said first electrode comprises at least three generally linear arms extending from a center of said piezoelectric plate to said rim portion generally in the shape of a T along diagonals of said piezoelectric plate.

15. A ladder filter comprising:

at least one serial connected two-terminal piezoelectric resonator element and at least one parallel connected two-terminal piezoelectric resonator element, in which at least one said two-terminal piezoelectric resonator elements operates in the expansion vibration mode and comprises:

a quadrilateral piezoelectric plate having first and second surfaces; and means for inducing expansion mode vibration in said piezoelectric plate, said means comprising:

a first electrode deposited on said first surface, said first electrode including a rim portion provided along at least part of the periphery of said piezoelectric plate, and a generally linear center portion formed continuous with said rim portion on said first surface and thereby electrically connected to the rim portion and extending along at least one diagonal of said piezoelectric plate; and a second electrode deposited on said second surface of said piezoelectric plate.

* * * * *